（12） United States Patent
Liu

(10) Patent No.: US 12,113,065 B2
(45) Date of Patent: Oct. 8, 2024

(54) FIN-BASED FIELD EFFECT TRANSISTOR (finFET) DEVICE WITH ENHANCED ON-RESISTANCE AND BREAKDOWN VOLTAGE

(71) Applicant: Avago Technologies International Sales Pte. Limited, Singapore (SG)

(72) Inventor: Qing Liu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 509 days.

(21) Appl. No.: 17/481,204

(22) Filed: Sep. 21, 2021

(65) Prior Publication Data

US 2023/0088066 A1    Mar. 23, 2023

(51) Int. Cl.
*H01L 29/78*     (2006.01)
*H01L 21/8234*   (2006.01)
*H01L 27/088*    (2006.01)
*H01L 29/08*     (2006.01)
*H01L 29/66*     (2006.01)

(52) U.S. Cl.
CPC .. *H01L 27/0886* (2013.01); *H01L 21/823418* (2013.01); *H01L 21/823431* (2013.01); *H01L 29/0847* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | |
|---|---|---|
| 9,472,615 B2 | 10/2016 | Zhang et al. |
| 2013/0175638 A1 | 7/2013 | Ho et al. |
| 2017/0154827 A1 | 6/2017 | Zhou |
| 2017/0194487 A1 | 7/2017 | Chen et al. |
| 2018/0108755 A1 | 4/2018 | Liu et al. |
| 2019/0103393 A1 | 4/2019 | Huang et al. |
| 2019/0333995 A1 | 10/2019 | Liu et al. |
| 2021/0135006 A1 | 5/2021 | Liu |

OTHER PUBLICATIONS

European Extended Search Report on EP Appln. 22196443.0 dated Feb. 13, 2023.

*Primary Examiner* — Joseph C. Nicely
*Assistant Examiner* — Lamont B Koo
(74) *Attorney, Agent, or Firm* — Foley & Lardner LLP

(57) ABSTRACT

A fin-based field effect transistor (finFET) device may include a fin structure having a first portion, a second portion and a third portion. The finFET device may include a first gate structure disposed over at least part of the first portion, a first source/drain region disposed in the first portion, and a second drain/source region disposed in the third portion. Each of the first, second and third portions may include one or more fin portions. The total fin count in the second portion is fewer than the total fin count in the first portion. The second portion may include a drift region. Methods of fabricating a finFET are also disclosed. The finFET device provides a lower on-resistance and a higher breakdown voltage than conventional finFETs.

19 Claims, 7 Drawing Sheets

FIN-BASED FIELD EFFECT TRANSISTOR (finFET) DEVICE WITH ENHANCED ON-RESISTANCE AND BREAKDOWN VOLTAGE

TECHNICAL FIELD

The present description relates generally to transistors, including, without limitation, fin-based field effect transistor (finFET) devices having enhanced on-resistance and breakdown voltages.

BACKGROUND

Integrated circuits (ICs) may include microprocessors, microcontrollers, static random access memories, communication circuits, digital logic circuits and other circuits and combinations of those circuits fabricated on a substrate. The ICs may include devices such as transistors. As IC devices continue scaling to smaller dimensions, various designs and techniques are employed to improve device performance. Fin-based structures, such as fin-based field effect transistor (finFET) structures, may be used as an alternative to planar metal-oxide-semiconductor field effect transistor (MOSFET) structures and can provide improved scalability. Fin-based fabrication techniques may be employed to create non-planar structures on a semiconductor substrate material (e.g., silicon), which may increase device density because the channel, source, and/or drain are raised out of the semiconductor substrate material in the form of a fin.

The description provided in the background section should not be assumed to be prior art merely because it is mentioned in or associated with the background section. The background section may include information that describes one or more aspects of the subject technology.

Figure 1A:
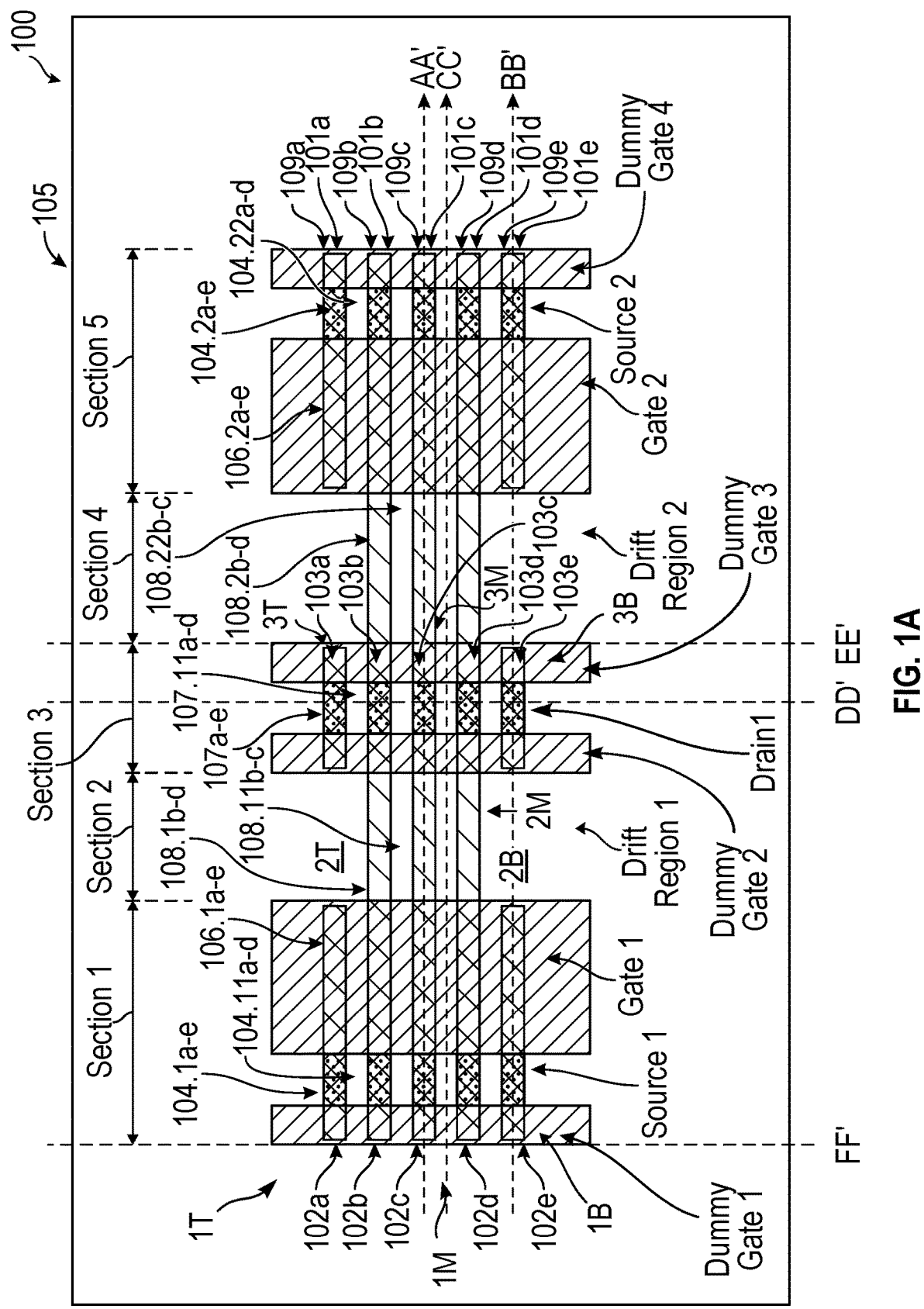
FIG. 1A illustrates a planar top view of an example of a finFET device.

In the drawings, like reference numbers may generally indicate identical, functionally similar, and/or structurally similar elements. In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive. Furthermore, for ease of illustration, the same or similar components are illustrated with the same or similar reference numbers. The descriptions provided with respect to a component with a given reference number in one or more figures may be applicable to a component with the same given reference number shown in one or more other figures unless stated otherwise or other descriptions are provided.

In one or more implementations, fin-based field effect transistor (finFET) devices are provided with lateral double-diffused metal-oxide-semiconductor (LDMOS) structures (e.g., super junction LDMOS structures). The LDMOS structures may include, for example, multiple alternating regions of n-type and p-type doped semiconductor. In one or more implementations, a structure and fabrication flow allows for smaller devices that can be operated at higher voltages and have lower on-resistance (Ron). In one or more implementations, the architecture of a finFET device provides compatibility with finFET-based complementary MOS (CMOS) device fabrication process flows, including smaller technologies such as 5 nanometer (nm), 7 nm, 14 nm and 16 nm technologies. In one or more implementations, a finFET device with enhanced capabilities may be fabricated using, for example, a 5 nm process, and such enhanced finFET may provide a low Ron with a high breakdown voltage. In one or more aspects, no additional mask steps or process steps are needed to provide the enhanced finFET device.

In one or more implementations, the finFET structure and fabrication flow of operations therefor advantageously reduce adverse effects associated with tighter fin pitches of finFET technology scaled to smaller sizes (e.g., 5 nm). A tighter fin pitch can result in thinner fins which degrades performance especially when raised source/drain epitaxial (EPI) processes are used. Therefore, as smaller scale processes are developed, a larger silicon (Si) area may be required for finFETs of similar characteristics. In one or more implementations, an enhanced finFET structure improves overall performance of the finFET device fabricated using smaller scale processes and provides a lower Ron and a higher breakdown voltage than conventional finFETs. Enhanced finFET structures may be provided in integrated circuits that utilize, for example, 0.65 V, 0.75 V, 1.8 V, 3.3 V and 5 V supply voltages and not have the disadvantages associated with tighter fin pitch of certain finFETs.

FIG. 1A illustrates a planar top view of an example of a finFET device. A finFET device 100 may include two or more fins 101a-e extending from the left end to the right end of the finFET device. In one aspect, the fins 101a-e do not touch the left and right ends. For example, the fins 101a-e may extend across sections 1-5, except that in this example, the fins 101a-e do not include two outer fin portions in each of sections 2 and 4 (e.g., fin portions 108.1a and 108.1e are not present in section 2 in regions 2T and 2B, respectively, and fin portions 108.2a and 108.2e are not present in section 4; hence, these are not shown in FIG. 1A). The number of fins 101a-e can be any number greater than one (e.g., from 2 to 20 or more depending upon system requirements and device characteristics). Lower Ron and higher current requirements can utilize more fins 101a-e in one or more implementations.

The finFET device 100 includes or is provided on or in a substrate 105. A fin structure may include multiple fins, such as the fins 101a-e. The fin structure may have multiple portions, for example, a first portion (in or across section 1), a second portion (in or across section 2), a third portion (in or across section 3), a fourth portion (in or across section 4), and a fifth portion (in or across section 5). The first portion may include fin portions 102a-e (in or across section 1). The second portion may include fin portions 108.1b-d (in or across section 2). The third portion may include fin portions 103a-e (in or across section 3). The fourth portion may include 108.2b-d (in or across section 4). The fifth portion may include fin portions 109a-e (in or across section 5). The fin portions 102a-e may include fin portions 104.1a-e and 106.1a-e, respectively. The fin portions 109a-e may include fin portions 106.2a-e and 104.2a-e, respectively. The fin portions 103a-e may include fin portions 107a-e, respectively. The fins 101a-e may be disposed above a top surface (or a first surface) of the substrate 105.

In one or more implementations, the fins 101a-e and their fin portions are parallel to one another and parallel to the direction of the fin length and are generally in a rectangular shape and formed in rows. In one or more examples, the fins 101a-e may include undoped Si formed by an epitaxial process. For an N-channel device, the sources and drains 104.1a-e, 104.2a-e and 107a-e may include highly concentrated N-type doped Si formed by an epitaxial process. The regions between the fin portions within a respective section (e.g., first regions 104.11a-d, third regions 108.11b-c, fourth regions 107.11a-d, fifth regions 108.22b-c and sixth regions 104.22a-d) may include dielectric materials, such as silicon dioxide.

In one or more examples, the width of each fin portion may be 4 to 10 nm, the distance or pitch between the fin portions may be 20 to 50 nm. In or more examples, the length of each of the fin portions 102a-e may be 50 to 100 nm, the length of each of the sources 104.1a-e and 104.2a-e may be 50 to 100 nm, the length of each of the channel portions 106.1a-e and 106.2a-e may be 120 to 600 nm, the length of each of the fin portions 108.1b-d and 108.2b-d may be 60 to 250 nm, and the length of each of the fin portions 103a-e may be 50 to 150 nm. The dimensions provided herein are non-limiting examples, and the subject technology may be used for other examples.

In one or more implementations, the fin portions 102a-e may include or are associated with respective sources 104.1a-e and respective channel portions 106.1a-e disposed in the fin portions 102a-e. The fin portions 103a-e may include or are associated with respective drains 107a-e disposed in the fin portions 103a-e. The fin portions 109a-e may include or are associated with respective channel portions 106.2a-e and respective sources 104.2a-e disposed in the fin portions 109a-e. The sources 104.1a-e and 104.2a-e and the drains 107a-e can be interchanged in one or more implementations. The finFET device 100 can be an N-channel or P-channel device in one or more implementations. The terms source/drain region and drain/source region can refer to either a source region or a drain region. For example, a first source/drain region may include sources 104.1a-e, a second drain/source region may include drains 107a-e, and a third source/drain region may include sources 104.2a-e. The channel portions 106.1a-e and 106.2a-e may be sometimes referred to as fin portions 106.1a-e and 106.2a-e.

The finFET 100 may include one or more gate structures (e.g., gate 1 and gate 2). The gate 1 may be disposed over at least part of the first portion (in or across section 1) of the fin structure (e.g., over the fin portions 106.1a-e). The gate 2 may be disposed over at least part of the fifth portion (in or across section 5) of the fin structure (e.g., over the channel portions 106.2a-e). Each of the gates 1 and 2 is generally perpendicular to the fin length. The gates 1 and 2 may be connected to each other using one or more conductive layers (not shown).

The finFET 100 may also include one or more dummy gate structures (e.g., dummy gate 1, dummy gate 2, dummy gate 3 and dummy gate 4). In one or more examples, the finFET fabrication process produces the dummy gates to aid the fabrication of various components of the finFET device. However, the dummy gates are not used as actual gates during the finFET device operation. The finFET 100 also includes one or more sources (e.g., source 1 and source 2). The source 1 may include sources 104.1a-e, and the source 2 may include sources 104.2a-e. The sources 1 and 2 may be connected to each other using one or more conductive layers (not shown). The finFET 100 also includes a drain (e.g., drain 1). The drain 1 may include drains 107a-e.

In one or more implementations, the finFET device 100 includes drift regions (e.g., a drift region 1 and a drift region 2). The second portion of the fin structure may include the drift region 1 (in or across section 2), and the fourth portion of the fin structure may include the drift region 2 (in or across section 4). The drift region 1 may include fin portions 108.1b-d, and the drift region 2 may include fin portions 108.2b-d.

In one or more implementations, each of the drift regions (or each of the second and fourth portions) may include a fewer number of fin portions than other portions of the fin structure. In one or more examples, the total number of fin portions in the second portion (e.g., the total number of fin portions 108.1b-d in or across section 2) is fewer than the total number of fin portions in the first portion (e.g., the total number of fin portions 102a-e in or across section 1). The total number of fin portions in the second portion may be one or greater than one, but not fewer than one. In this example, the total number of fin portions in the fourth portion (e.g., the total number of fin portions 108.2b-d in or across section 4) is the same as the total number of fin portions in the second portion. In this example, the total number of fin portions in the first portion is the same as the total number of fin portions in each of the third portion and the fifth portion.

In one or more implementations, with respect to each of the second and fourth portions (in or across section 2 or 4, respectively), the top and bottom outer portions (e.g., regions 2T and 2B for section 2) do not have fin portions. In one or more examples, a top outer portion of the second portion (e.g., region 2T) includes no fin portion. In one or more examples, a bottom outer portion of the second portion (e.g., region 2B) includes no fin portion. In one or more examples, the middle portion of the second portion (e.g., a region 2M) includes at least one fin portion. A similar arrangement applies to the fourth portion.

In one or more implementations, having a fewer number of fin portions in the second portion in comparison to each of the first and third portions can provide a lower Ron and a higher breakdown voltage. In one or more implementations, having a fewer number of fin portions in each of the second and fourth portions in comparison to each of the first, third and fifth portions can provide a lower Ron and a higher breakdown voltage.

In one or more examples, the fin portions in each of the second and fourth portions are preferably symmetrical about a center line (e.g., the line AA' in this example) of the respective portion. In one or more examples, it is preferable to have the fin portions (e.g., 108.1*b-d* and 108.2*b-d*) disposed in a middle portion (rather than the top and bottom outer portions) of each of the second and fourth portions to minimize, for example, the effect of process variations. In this example, each of the fin portions of the fins 101*b-d* (disposed in the middle portions) exist in the first, second, third, fourth and fifth portions of the fin structure. In this example, each of the fin portions of the fins 101*a* and 101*e* (disposed in the top and bottom outer portions) exist only in the first, third and fifth portions of the fin structure. The second and fourth portions of the fin structure do not include fin portions of the fins 101*a* and 101*e* (i.e., the outer fins).

FIG. 1A illustrates a top outer portion 1T, a middle portion 1M and a bottom outer portion 1B in the first portion (e.g., in or across section 1), a top outer portion 2T, a middle portion 2M, and a bottom outer portion 2B in the second portion (e.g., in or across section 2), and a top outer portion 3T, a middle portion 3M, a bottom outer portion 3B in the third portion (e.g., in or across section 3). While not explicitly shown in FIG. 1A, the fourth portion (e.g., in or across section 4) has a top outer portion, a middle portion, and a bottom outer portion similar to those of the second portion. While not explicitly shown in FIG. 1A, the fifth portion (e.g., in or across section 5) has a top outer portion, a middle portion, and a bottom outer portion similar to those of the first portion.

In one or more implementations, a first fin portion (e.g., each of 102*b*, 102*c* and 102*d*) in the first portion is connected to a first fin portion (e.g., 103*b*, 103*c* and 103*d*, respectively) in the third portion via a first fin portion (e.g., 108.1*b*, 108.1*c* and 108.1*d*, respectively) in the second portion. A second fin portion (e.g., each of 102*a* and 102*e*) in the first portion is separated from a second fin portion in the third portion (e.g., 103*a* and 103*e*, respectively) by at least a separation area in the second portion. A separation area may be, for example, an area in the second portion between the right edge of a fin portion in the first portion and the left edge of a fin portion in the third portion. Similarly, a third fin portion (e.g., each of 109*b*, 109*c* and 109*d*) in the fifth portion is connected to the first fin portion (e.g., 103*b*, 103*c* and 103*d*, respectively) in the third portion via a third fin portion (e.g., 108.2*b*, 108.2*c* and 108.2*d*, respectively) in the fourth portion. A fourth fin portion (e.g., each of 109*a* and 109*e*) in the fifth portion is separated from the second fin portion in the third portion (e.g., 103*a* and 103*e*, respectively) by at least a second separation area in the fourth portion. A second separation area may be, for example, an area in the fourth portion between the right edge of a fin portion in the third portion and the left edge of a fin portion in the fifth portion.

In one or more implementations, a second portion (e.g., across section 2) may include a drift region (e.g., drift region 1). The second portion does not include any gate structure (e.g., gate 1), any source/drain region (e.g., source 1), or any second drain/source region (e.g., drain 1). Similarly, a fourth portion (e.g., across section 4) may include a drift region (e.g., drift region 2). The fourth portion does not include any gate structure (e.g., gate 2), any source/drain region (e.g., source 2), or any second drain/source region (e.g., drain 1).

The finFET device 100 shown in FIG. 1A includes two gate structures (e.g., gates 1 and 2), two source regions (e.g., sources 1 and 2), and one drain region (e.g., drain 1). In this example, the components may be symmetrical about the plane DD' (a middle line in section 3) and also about the line AA'.

In another implementation, a fin FET device may include one gate structure (e.g., gate 1), one source region (e.g., source 1) and one drain region (e.g., drain 1), but not include the second gate structure (e.g., gate 2) or the second source region (e.g., source 2). In this example, the fin FET device may include the components in sections 1, 2 and 3 but not include the components in sections 4 and 5 of FIG. 1A.

Figure 1B:
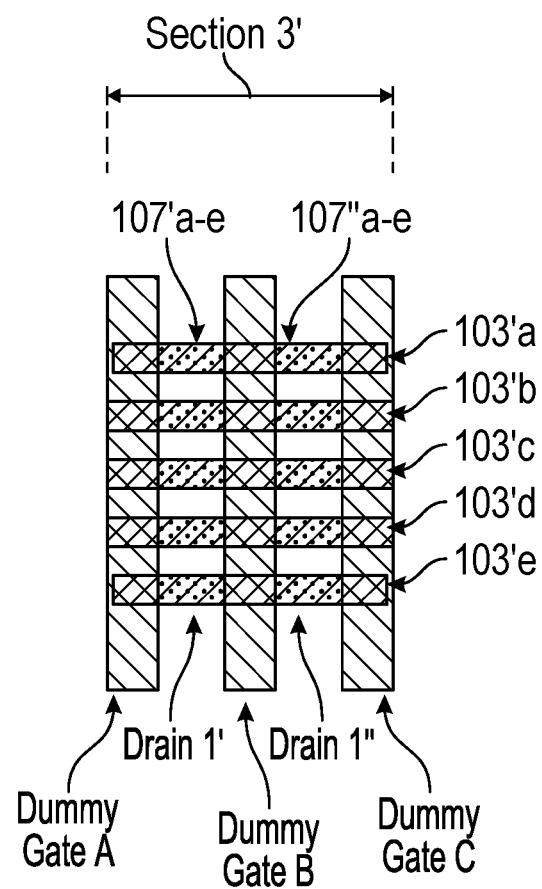
FIG. 1B illustrates an example of a double drain region.

In yet another implementation, a fin FET device's drain region may have a double drain region, as shown in FIG. 1B. FIG. 1B illustrates section 3', which is a modified version of section 3 of FIG. 1A. A double drain region may include three dummy gates (e.g., dummy gates A, B and C in parallel) instead of two dummy gates. The double drain region may have fin portions 103'*a-e* that are longer than the fin portions 103*a-e* in order to accommodate three dummy gates. The fin portions 103'*b-d* may be connected to the fin portions 108.1*b-d* and 108.2*b-d*. The fin portions 103'*a* and 103'*e* are separated from the fin portions 102*a* and 109*a* and from the fin portions 102*e* and 109*e*, respectively. The double drain region may have two sets of drains (e.g., drain 1' and drain 1"). The first set of drains 107'*a-e* may be disposed between the dummy gates A and B. The second set of drains 107"*a-e* may be disposed between the dummy gates B and C. A double drain region (having two drain regions instead of one drain region) may provide resistance reduction, lower electric field and less current crowding. In one example, section 3' may replace section 3 to create a finFET device with two gate structures, two source regions and one double drain region. This finFET includes sections 1, 2, 3', 4 and 5. In another example, section 3' may replace section 3 to create another finFET device with one gate structure, one source region and one double drain region. This finFET includes sections 1, 2 and 3'.

Figure 2:
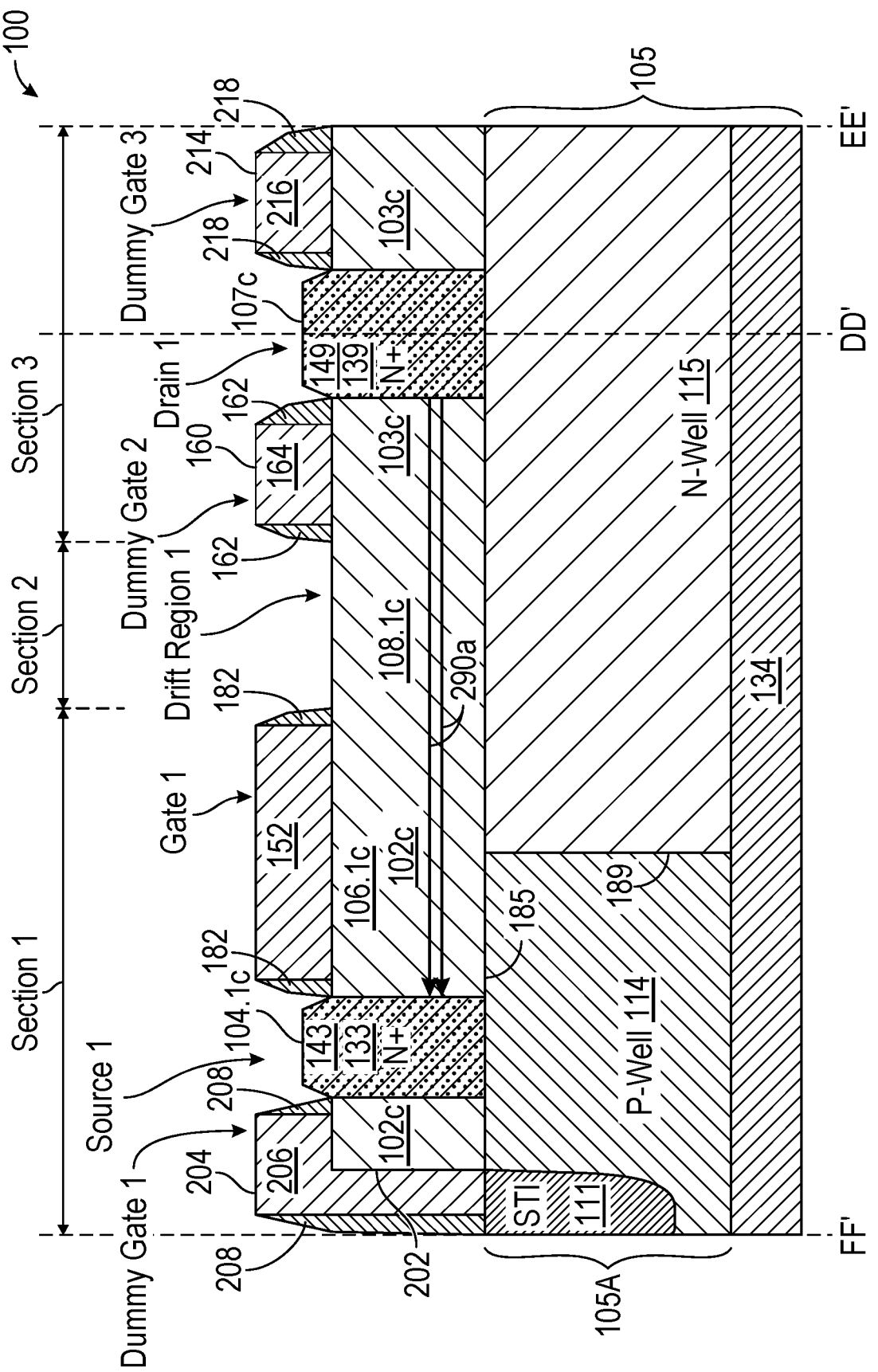
FIG. 2 illustrates an example of a cross-sectional view of the finFET device depicted in FIG. 1A along a line AA' in a direction parallel to a fin length.

FIG. 2 illustrates an example of a cross-sectional view of the finFET device 100 depicted in FIG. 1A along the line AA' (along the fin 101*c*) between the plane FF' and the plane EE', including sections 1, 2 and 3. The finFET device 100 includes the substrate 105 which may have a top substrate 105A and a bottom substrate 134. The top substrate 105A may include a dielectric material 111, a well region 114 and a well region 115. In FIG. 2, the finFET device 100 includes a portion of the fin portion 102*c*, a source 104.1*c* in the fin portion 102*c*, a channel portion 106.1*c* in the fin portion 102*c*, the fin portion 108.1*c*, a left portion of the fin portion 103*c*, the drain 107*c* in the fin portion 103*c*, and a right portion of the fin portion 103*c*.

With reference to FIGS. 1A and 2, the finFET device 100 includes the gate 1 and the drift region 1. The drift region 1 (having the fin portion 108.1*c*) is above the first surface 185 (or the top surface) of the substrate 105. The dielectric material 111 may be a trench, for example, a shallow trench isolation (STI) region in one or more examples. In one or more implementations, a trench may be a deep trench isolation region or a locally grown isolation region. A trench may be, for example, silicon dioxide. The drift region 1 and the fin portion 108.1*c* are over a first part of the well region 115 and is not over any trench.

The source 1 (including the source 104.1*c* includes highly doped regions (N-type), such as a region 133 in FIG. 2, in one or more implementations. The drain 1 (including the drain 107*c*) includes highly doped regions (N-type), such as a region 139, in one or more implementations. In one or more examples, regions 133 and 139 are epitaxial doped regions (e.g., in-situ doped phosphorous). In one or more implementations, the region 133 includes a doped epitaxial region 143 (e.g., N-type), and the region 139 includes a doped epitaxial region 149 (e.g., N-type). In one or more examples, and the region 133 is disposed in or above the fin portion 102c, and the region 139 is disposed in or above the fin portion 103c.

The substrate 105 includes the bottom substrate 134 (e.g., a bulk silicon substrate lightly doped with a p-type dopant such as boron) and the top substrate 105A that is doped to form well regions 114 and 115 which may have different doping (e.g., different type of dopants). The well region 114 is a P-well, and the well region 115 is an N-well in one or more implementations. The bottom substrate 134 is below the well regions 114 and 115 and is a lightly doped p-type region in one or more implementations.

In one or more implementations, the substrate 105 may be a p-type substrate. The well region 115 and the epitaxial regions 133 and 139 (including 143 and 149) include an n-type dopant. The well region 114 includes a p-type dopant. The finFET device 100 formed from such an arrangement of the p-type and n-type regions may be referred to as a super junction n-type LDMOS (NLDMOS) device with an associated NLDMOS doping profile with a single drain or a double drain. The well region 114 (e.g., a p-well region) may be depleted by an adjacent n-region (e.g., the well region 115). For a p-type LDMOS (PLDMOS) device, the p-type and the n-type regions are reversed from that previously described (e.g., the well region 114 is doped with an n-type dopant, the well region 115 is doped with a p-type dopant, the regions 133 and 139 (including 143 and 149) are doped with a p-type dopant, etc.); however, the bottom substrate 134 may be lightly doped with a p-type dopant. In one or more examples, both the top substrate 105A and the bottom substrate 134 are a bulk substrate. In another example, the top substrate 105A is an epitaxially grown layer, and the bottom substrate 134 is a bulk substrate.

In one or more implementations, the well region 115 may have a doping concentration lower than a doping concentration of the epitaxial regions 133 and 139 (including 143 and 149). The bottom substrate 134 may have a doping concentration lower than that of the well regions 114 and 115. In one or more examples, the portions 102c (including the portion 106.1c), 108.1c and 103c are undoped silicon and epitaxially grown. The portions 133 and 139 (including 143 and 149) are highly doped n-type regions and epitaxially grown. The portions 102c (including the portion 106.1c), 108.1c and 103c have a doping concentration lower than that of the portions 133 and 139 (including 143 and 149).

For p-type doping, boron may be utilized as the dopant material. For n-type doping, phosphorus or arsenic may be utilized as the dopant material. Doping concentration for the well regions 115 and/or 114 may be between $10^{18}$ cm$^{-3}$ and $10^{19}$ cm$^{-3}$. Doping concentration for the epitaxial regions 133 and 139 (including 143 and 149) may be between $10^{20}$ cm$^{-3}$ and $10^{21}$ cm$^{-3}$. The dopant materials and doping concentrations are provided by way of non-limiting example, and other dopant materials and doping concentrations may be utilized. The type of dopant (e.g., p-type, n-type), dopant material, and doping concentration may be selected based on, for instance, device characteristics such as threshold voltage requirements.

In one or more implementations, a source contact and a drain contact may be coupled to the epitaxial region 143 and the epitaxial region 149, respectively. The gate 1 is disposed over three sides of the fin portions 106.1c of the fin 101c between the source 1 (e.g., the epitaxial region 133) and the drift region 1.

Figure 3:
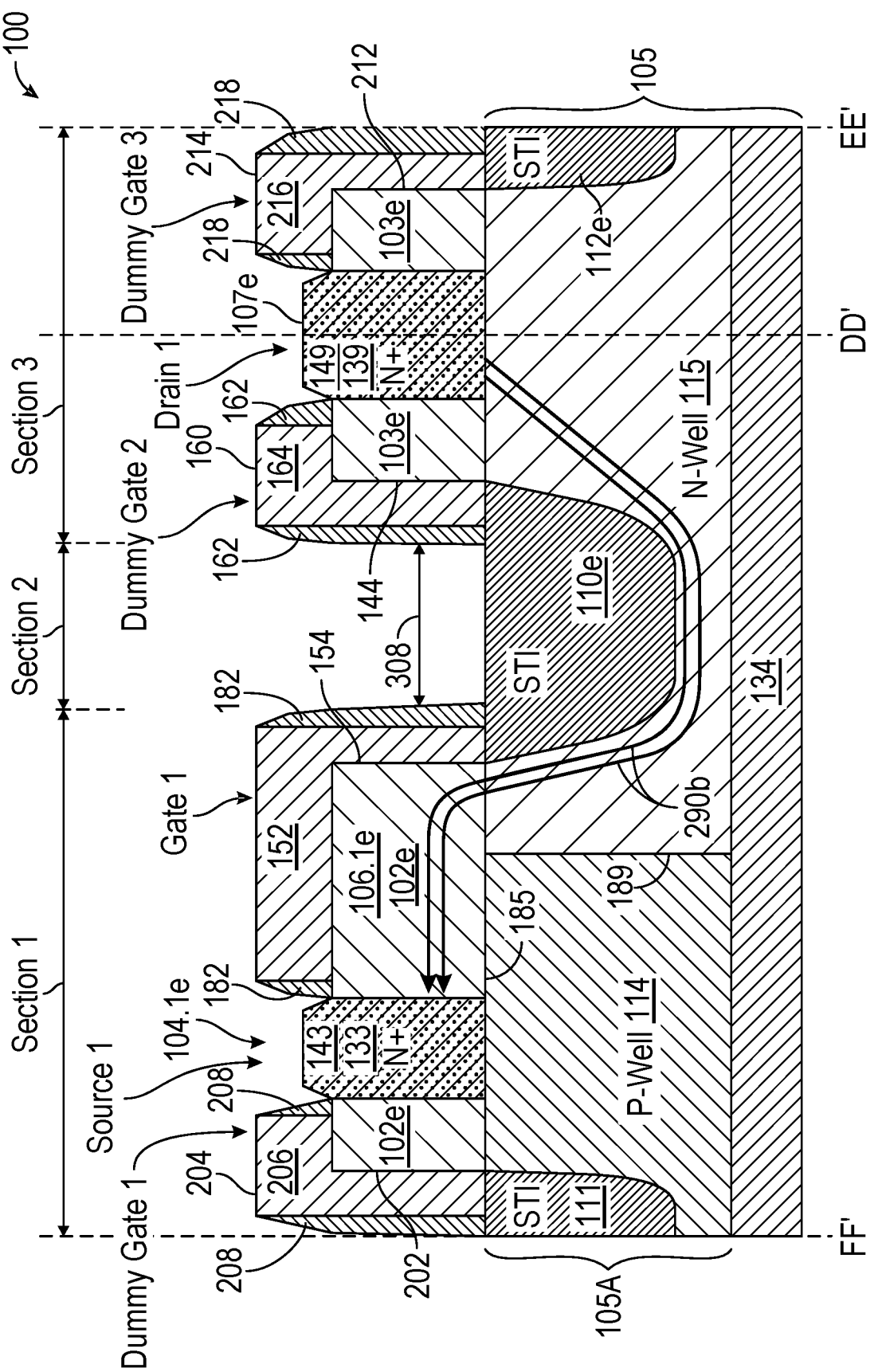
FIG. 3 illustrates an example of a cross-sectional view of the finFET device depicted in FIG. 1A along a line BB' in a direction parallel to a fin length.

Example bias voltages applied to the source contact, the gate (e.g., gate 1) and the drain contact may be 0 V, 1.8 V and 3.3 V, respectively. In one or more implementations, the gate 1 may be biased to deplete a channel below the gate 1. In one or more implementations, the epitaxial region 133 may allow for depletion of the portion 106.1c of the portion 102c. A channel current path 290a is provided from the drain 1 (or the epitaxial region 139) through the left portion of the fin portion 103c, through the fin portion 108.1c, through the channel portion 106.1c to the source 1 (or the epitaxial region 133). This path provides a lower Ron than a path that includes one or more well regions (e.g., as shown in FIG. 3).

The drain 107c (including the epitaxial region 139) may be formed in the portion 103c defined by two dummy gate structures (e.g., dummy gates 2 and 3). The dummy gate structure 160 of the dummy gate 2 may include spacers 162 and a dummy gate material 164. The dummy gate structure 214 of the dummy gate 3 may include spacers 218 and a dummy gate material 216. An end 202 of the portion 102c is covered by a dummy gate structure 204 of the dummy gate 1, including a dummy gate material 206 and spacers 208. The dummy gate structure 204 is provided over at least a portion of the dielectric material 111. One edge of the dielectric material 111 may align with the end 202. The source 1, the gate 1 and the drain 1 may be connected to their respective contacts or electrodes. The areas above the dummy gates, the source 1, the gate 1 and the drain 1 not filled by contacts and electrodes may be filled with dielectric material. The drift region 1 above the portion 108.1c may be filled with dielectric material.

The drift region 1 (e.g., the portion 108.1c) may be defined by the structure of the gate 1 and the dummy gate structure 160 of the dummy gate 2. The structure of the gate 1 may include spacers 182. The spacers 208, 182, 162, and 218 and associated dummy gate material confine ends or sides of the fins 101a-e to protect them from lateral and other growth during epitaxy.

The gate 1 includes a gate conductor 152. The gate conductor 152 can be a metal material or a doped polysilicon material. The gate conductor 152 is provided over the channel portion 106.1c and is provided above the first surface 185 of the substrate 105. The gate conductor 152 can cover three sides of the portion 106.1c of the fin 101c not in contact with the surface 185 of the substrate 105.

The gate 1 (gate conductor 152) is provided above a boundary 189 between the well regions 114 and 115. Spacers 208, 182, 162 and 218 are dielectric material, such as silicon dioxide, silicon nitride, etc. The gate 1 may include a gate oxide material, a gate dielectric material, and a work function metal. For ease of understanding, the oxide material, dielectric material, and work function metal are not shown in the figures.

While FIG. 2 is illustrated with respect to the fin 101c, the descriptions provided for FIG. 2 may describe the fins 101b and 101d in an identical or similar manner. While FIG. 2 illustrates sections 1, 2 and 3 of the finFET 100 along the line AA', the descriptions provided for FIG. 2 may describe sections 4 and 5 along the line AA' in an identical or similar manner as the finFET 100 is symmetrical about the plane DD'.

FIG. 3 illustrates an example of a cross-sectional view of the finFET device depicted in FIG. 1A along the line BB' (along the fin 101e) between the plane FF' and the plane EE', including sections 1, 2 and 3. The descriptions provided with respect to a component with a given reference number in FIGS. 1A, 1B and 2 may be applicable to a component with the same given reference number shown in FIG. 3 unless stated otherwise or other descriptions are provided.

With reference to FIG. 3, the finFET device 100 includes the bottom substrate 134 and the top substrate 105A, which has the dielectric material 111, a dielectric material 110e, a dielectric material 112e, the well region 114 and the well region 115. The finFET device 100 includes a left portion of the fin portion 102e, a source 104.1e in the fin portion 102e, a channel portion 106.1e in the fin portion 102e, a left portion of the fin portion 103e, the drain 107e in the fin portion 103e, and a right portion of the fin portion 103e.

Unlike FIG. 2, the channel portion 106.1e in FIG. 3 is separated from the portion 103e. The separation distance may be at least a separation area 308 in section 2. The separation distance may further include a first distance between the right edge 154 of the portion 106.1e and the left end of the separation area 308, and a second distance between the right end of the separation area 308 and the left end 144 of the portion 103e.

Unlike FIG. 2, the well region 115 of FIG. 3 includes the dielectric materials 110e and 112e. The dielectric materials 110e and 112e may be formed in a manner identical or similar to the dielectric material 111 and have identical or similar compositions. Like the dielectric material 111, the dielectric materials 110e and 112e may be a trench, such as an STI region. A left edge of the dielectric material 110e may align with the right edge 154 of the portion 106.1e. A right edge of the dielectric material 110e may align with the left end 144 of the portion 103. A left edge of the dielectric material 112e may align with the right end 212 of the portion 103e. There is no fin portion above or over the dielectric material 110e. The separation area 308 in the second portion is over a portion of the well region 115 and is over at least part of the dielectric material 110e, which is a trench or an STI. The separation area may be filled with a dielectric material.

The separation area 308 may be defined by the structure of the gate 1 and the dummy gate structure 160. Gate conductor 152 is provided over an end 154 of the portion 106.1e and is provided above the first surface 185 of the substrate 105. The gate conductor 152 can cover four sides of the portion 106.1e (including the end 154). The dummy gate structure 160 is provided over four sides of the portion 103e (including the end 144).

While FIG. 3 is illustrated with respect to the fin 101e, the descriptions provided for FIG. 3 may describe the fin 101a in an identical or similar manner. While FIG. 3 illustrates sections 1, 2 and 3 of the finFET 100 along the line BB', the descriptions provided for FIG. 3 may describe sections 4 and 5 along the line BB' in an identical or similar manner as the finFET 100 is symmetrical about the plane DD'.

Figure 4:
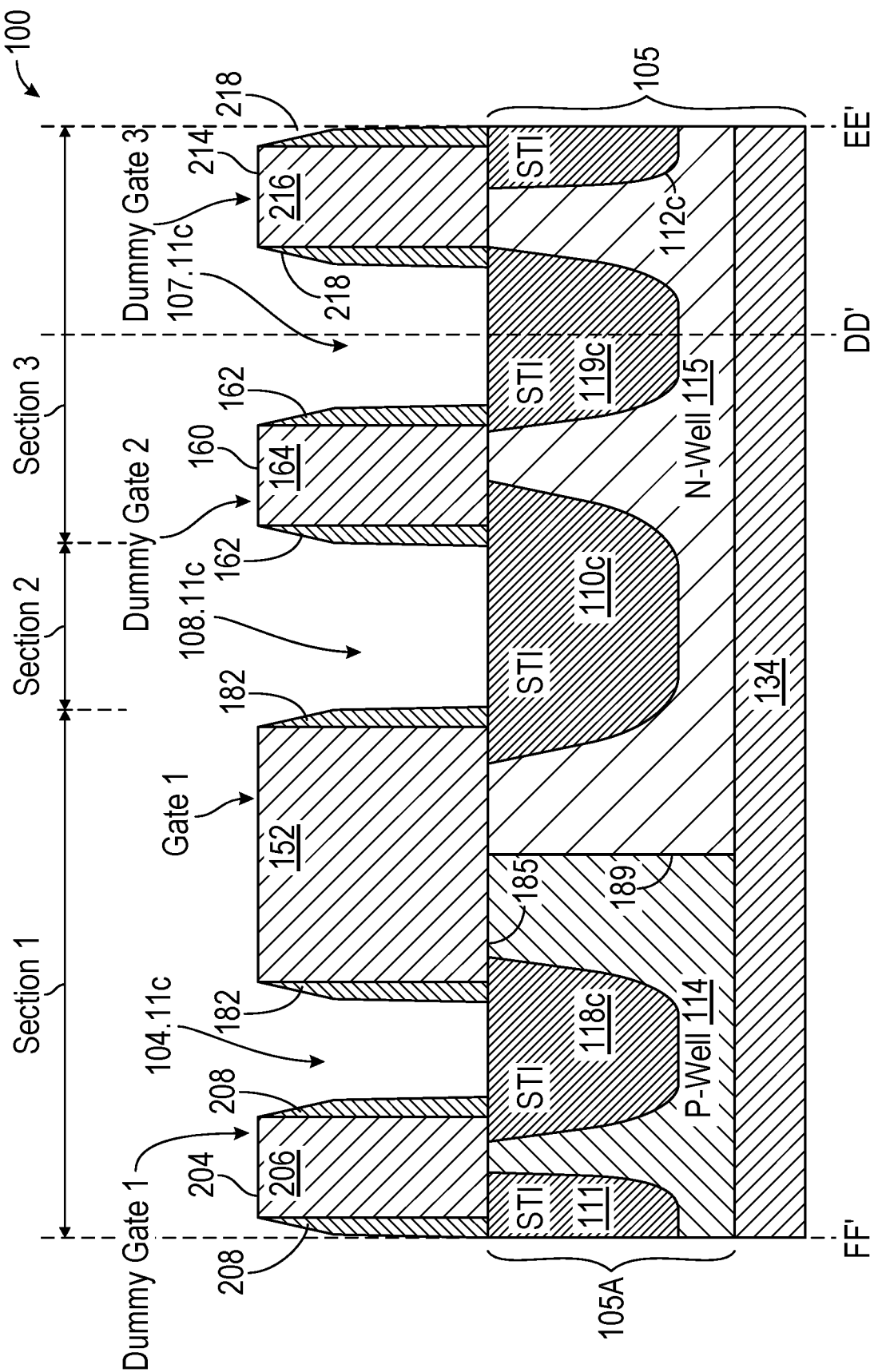
FIG. 4 illustrates an example of a cross-sectional view of the finFET device depicted in FIG. 1A along a line CC' in a direction parallel to a fin length.

FIG. 4 illustrates an example of a cross-sectional view of the finFET device depicted in FIG. 1A along the line CC' (along a space between fins 101c and 101d) between the plane FF' and the plane EE', including sections 1, 2 and 3. The descriptions provided with respect to a component with a given reference number in FIGS. 1A, 1B, 2 and 3 may be applicable to a component with the same given reference number shown in FIG. 4 unless stated otherwise or other descriptions are provided.

With reference to FIG. 4, the finFET device 100 includes the bottom substrate 134 and the top substrate 105A, which has the dielectric material 111, a dielectric material 118c, a dielectric material 110c, a dielectric material 119c, a dielectric material 112c, the well region 114 and the well region 115. FIG. 4 depicts the space between fins 101c and 101d along the line CC' in FIG. 1A, and unlike FIGS. 2 and 3, the finFET device 100 does not include any fin portions in this space.

Unlike FIGS. 2 and 3, a region between the dummy gate 1 and the gate 1 does not have any fin portions. With reference to FIGS. 1A and 4, the region 104.11c is located between the dummy gate structure 204 and the structure of the gate 1 and between the fins 101c and 101d. The region 104.11c is defined by the dummy gate structure 204 and the structure of the gate 1 and by the sources 104.1c and 104.1d. The region 104.11c is located at a first end portion between the fin portions 102c and 102d in the first portion and is disposed over a portion of the well region 114 and is disposed over at least part of the dielectric material 118c, which is a trench or an STI. The region 104.11c may be filled with a dielectric material.

A region at the gate 1 between the fin portions 102c and 102d does not have any fin portions. With reference to FIGS. 1A and 4, this region is defined by the channel portions 106.1c and 106.1d at the structure of the gate 1. This region is located at the structure of the gate 1 between the fin portions 102c and 102d in the first portion and is disposed over a portion of the well region 114 and over a portion of the well region 115.

A region between the gate 1 and the dummy gate 2 does not have any fin portions. With reference to FIGS. 1A and 4, the region 108.11c is located between the structure of the gate 1 and the dummy gate structure 2 and between the fins 101c and 101d. The region 108.11c may be defined by the structure of the gate 1 and the dummy gate structure 2 and by the fin portions 108.1c and 108.1d. The region 108.11c is located between the fin portions 108.1c and 108.1d in the second portion and is disposed over a portion of the well region 115 and is disposed over at least part of the dielectric material 110c, which is a trench or an STI. The region 108.11c may be filled with a dielectric material.

A region between the dummy gate 2 and the dummy gate 3 does not have any fin portions. With reference to FIGS. 1A and 4, the region 107.11c is located between the dummy gates 2 and 3 and between the fins 101c and 101d. The region 107.11c may be defined by the dummy gate structures 160 and 214 and by the drains 107c and 107d. The region 107.11c is located between the fin portions 103c and 103d in the third portion and is disposed over a portion of the well region 115 and is disposed over at least part of the dielectric material 119c, which is a trench or an STI. The region 107.11c may be filled with a dielectric material.

While FIG. 4 is illustrated with respect to a region between the fins 101c and 101d, the descriptions provided for FIG. 4 may describe other spaces (e.g., a region between the fins 101b and 101c) in an identical or similar manner. The descriptions provided for FIG. 4 may also describe a region between the fins 101a and 101b and a region between the fins 101d and 101e in an identical or similar manner, except that a region on a first side of the fin portion 108.1b away from the portion 108.1c (e.g., the region 2T above the fin portion 108.1b in FIG. 1A) may be defined by the structure of the gate 1 and the dummy gate structure 2 and by the fin portion 108.1b and the dielectric in section 2 between the portions 106.1a and 103a and that a region on a second side of the fin portion 108.1d away from the portion 108.1c (e.g., the region 2B below the fin portion 108.1d in FIG. 1A) may be defined by the structure of the gate 1 and the dummy gate structure 2 and by the fin portion 108.1d and the dielectric in section 2 along the line BB'. While FIG. 4 illustrates sections 1, 2 and 3 of the finFET 100 along the line CC', the descriptions provided for FIG. 5 may describe sections 4 and 5 along the line CC' in an identical or similar manner as the finFET 100 is symmetrical about the plane DD'.

Figure 5:
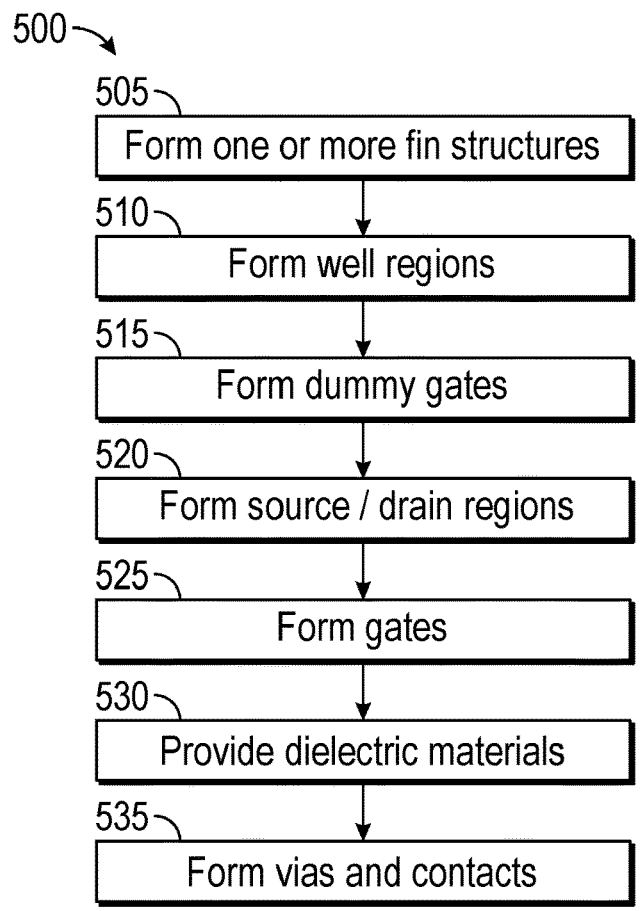
FIG. 5 illustrates a flow diagram of an example of fabrication operations for forming a finFET device.

FIG. 5 illustrates a flow diagram of example fabrication operations 500 for forming a finFET device in accordance with one or more implementations. The operations 500 do not need to be performed in the order shown. It is understood that the depicted order is an illustration of one or more example approaches, and the subject technology is not meant to be limited to the specific order or hierarchy presented. For example, based on preferences and/or specifications (e.g., cost, available materials, performance specifications), the specific order or hierarchy of the blocks may be rearranged or adjusted, and some operations may be removed while others may be added. Two or more of the operations can be performed simultaneously. In one or more implementations, the operations 500 may be utilized to form the finFET device 100 described with respect to FIGS. 1A, 1B, 2, 3 and 4. Other finFET devices in accordance with one or more implementations may be formed by the operations 500. Other flows in accordance with one or more implementations can be realized to form the finFET device 100.

For explanatory purposes, the example operations 500 are primarily described herein with reference to FIGS. 1A, 2, 3 and 4. One or more fin structures (e.g., fins 101a-e) are formed on the substrate 105 in an operation 505. In one or more implementations, fin structures may be formed using spacer lithography. In one or more implementations, fin structures are provided in a semiconductor layer above a substrate, formed by etching the substrate, grown on the substrate, or otherwise formed. A fin pitch may be measured from a point on one fin to the same point on another fin (e.g., a distance between the same points on two adjacent fins, such as fins 101b and 101c). A fin length (e.g., the length across sections 1, 2 and 3 for a single gate finFET or the length across sections 1, 2, 3, 4 and 5 for a double gate finFET in FIG. 1A) may be in the tens of microns or less in one or more implementations. The substrate 105 can be a bulk substrate or a silicon-on-insulator substrate. The top substrate 105A can be a bulk substrate or a silicon-on-insulator substrate. In another configuration, the top substrate 105A may be an epitaxially grown substrate. In one or more implementations, fin dimensions (e.g., fin width, fin length) and fin spacing between the fin structures need not be the same between any two adjacent or non-adjacent fin structures. The fin length employed may depend on a desired channel length and/or fin numbers. In one or more implementations, a fin structure may be cut to form shorter fin structures. At higher voltage, wider dielectric material (e.g., 110e, 110c) and longer gates (e.g., gates 1 and 2) are used in one or more implementations.

The substrate 105 may be, or may include, semiconductor material such as silicon, silicon-germanium, and gallium-arsenide. In one or more implementations, one or more fin structures may be formed as part of an STI process. For example, the STI process may involve forming STI regions (e.g., material 110c, 110e, 111, 112c, 112e. 118c, 119c and other similar areas) in the substrate 105. The STI process for forming the materials 110c and 110e and other similar materials may form the separation area 308 (in section 2) between the portions 102a, 102e and the portions 103a, 103e, respectively, in one or more implementations. The other similar materials mentioned in the previous sentence may include, for example, (i) a dielectric material formed in the top substrate 105A below the separation area between portions 106.1a and 103a (in a region 2T of FIG. 1A), (ii) a dielectric material formed in the top substrate 105A (in region 2T) below the separation area that is adjacent to the portion 108.1b but does not abut the portion 108.1c, (iii) a dielectric material formed in the top substrate 105A below the portion 108.11b, and (iv) a dielectric material formed in the top substrate 105A (in a region 2B) below the separation area that is adjacent to the portion 108.1d but does not abut the portion 108.1c. The separation area 308 may be 80-110 nm wide in one or more implementations. The fin height may be about 40-50 nms, and an STI depth for material 111 and materials 112c and 112e may be approximately 60-100 nms. The materials 118c and 119c may be about 60-100 nm deep. The finFET device 100 can be surrounded by the material 111, and the material 111 can be disposed between the fins 101a-e. The materials 110c and 110e may be approximately 200 nm deep in one or more implementations. Other dimensions are possible.

The well regions (e.g., the well region 114 and the well region 115) are patterned and formed in an operation 510. The well regions 114 and 115 may be formed by applying dopants (e.g., via ion implantation) to the substrate 105. The dopant type and doping concentration of the well regions 114 and 115 may be tuned to meet specifications (e.g., cost, performance, etc.) for a resulting finFET device (e.g., the finFET device 100) and are formed by ion implantation or using doped epitaxial materials. In one or more implementations, the well regions 114 and 115 may be tuned to fit a thermal voltage requirement.

In an operation 515, dummy gate material is patterned and deposited onto the substrate 105 (e.g., the surface 185 of the substrate 105), including the fin structures (e.g., the fins 101a-e). The dummy gate material may include polysilicon. The gate material may be utilized to form metal structures of the gate 1 of fins 101a-e. The gate 1 may straddle or surround multiple fins (or fin portions). Spacers, such as the spacers 208, 182, 162, and 218, are provided after the dummy gate material is deposited and etched back in one or more implementations.

In an operation 520, the sources 104.1a-e and 104.2a-e and the drains 107a-e are doped by performing lithography to open regions of the fin structure (e.g., open regions of the fin portions 102a-e and 109a-e corresponding to 104.1a-e and 104.2a-e). The epitaxial regions 133 and 139 (including 143 and 149) are formed in the opened regions, with dopants incorporated in the epitaxial materials that are grown. The epitaxial materials may be silicon or silicon-germanium with dopants incorporated in the silicon or silicon-germanium. In one or more implementations, ion implantation may be performed to increase the doping concentration of the epitaxial regions 133 and 139 (including 143 and 149). In one or more implementations, the epitaxial regions 133 and 139 (including 143 and 149) may be formed by epitaxial growth, drive-in anneal, and/or ion implantation. A height (e.g., vertical direction) of the epitaxial regions 133 and 139 (including 143 and 149) may be tuned based on, for instance, doping concentration in the epitaxy and ion implantation. A length of the epitaxial regions 133 and 139 (including 143 and 149) may be controlled through lithography.

In one or more implementations, the dummy gate materials are removed and replaced in an operation 525. The gates 1 and 2 may straddle or surround respective multiple fins. In one or more implementations, the gates 1 and 2 may be formed by removing dummy material and depositing one or more dielectric materials and one or more conductive materials. An oxide material, such as silicon dioxide, may exist under one or more conductive structures and form a part of the gate. In one or more implementations, the oxide material is deposited prior to depositing the gate material and can be a dielectric with a high dielectric constant (K).

The gate 1 may include spacers 182 which can be formed when spacers 208, 162 and 218 are formed (e.g., in the operation 515). The gate 1 includes the gate conductor 152 which is asymmetric with respect to the gate conductor 152 for a more shallow drain. The gate 1 may include two fingers (gate conductor 152 and another conduct that is not shown) in one or more implementations. The gate 2 may have the same or similar structure as the gate 1.

In one or more implementations, one or more layers of dielectric material may be deposited (e.g., in the operation 530) above the surface 185 of the substrate that has trenches (e.g., 111, 110c, 110e, 112c, 112e, 118c and 119c), and the formation of the gates 1 and 2 may be followed by the formation of vias and contacts (e.g., in the operation 535).

In one or more implementations, finFET devices may be double-gate finFET devices that include a super junction LDMOS structure with multiple alternating regions of n-type and p-type doped semiconductor. The alternating regions may facilitate depletion of a region at a relatively low voltage and may result in a high breakdown voltage. One or more drift regions (e.g., an n-type channel, an n-type portion of a fin structure) may be depleted by one or more adjacent p-type regions (e.g., a p-type well region, a p-type portion of a fin structure). Breakdown voltage may be increased through such depletion. In one or more implementations, the subject technology allows for smaller devices that may be operated at higher voltages and may have lower on-resistance.

Figure 6:
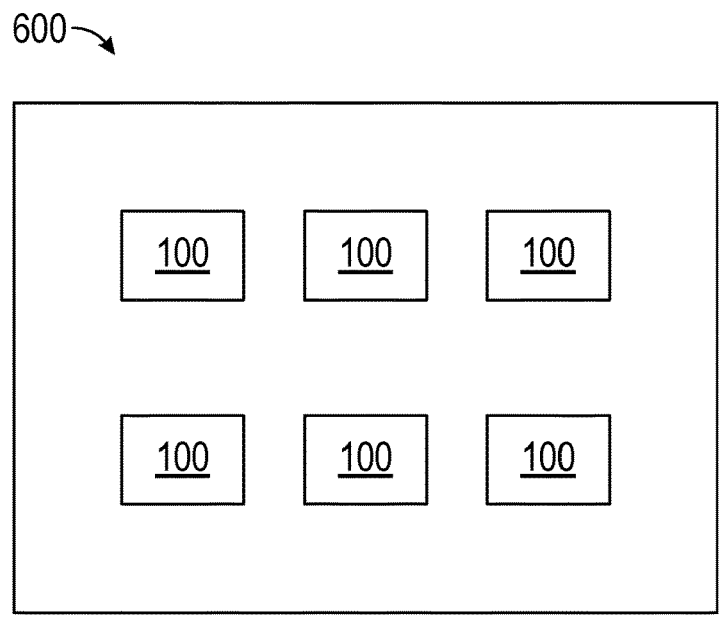
FIG. 6 illustrates a block diagram of an example of an integrated circuit.

FIG. 6 illustrates a block diagram of an example integrated circuit. In one or more implementations, an integrated circuit 600 may include a plurality of devices. Such devices may include, for example, power amplifiers and/or radio frequency (RF) circuits. Each of such devices may include one or more finFETs 100. The integrated circuit may be a packaged IC, which may be sometimes referred to as a packaged IC chip.

Figure 7:
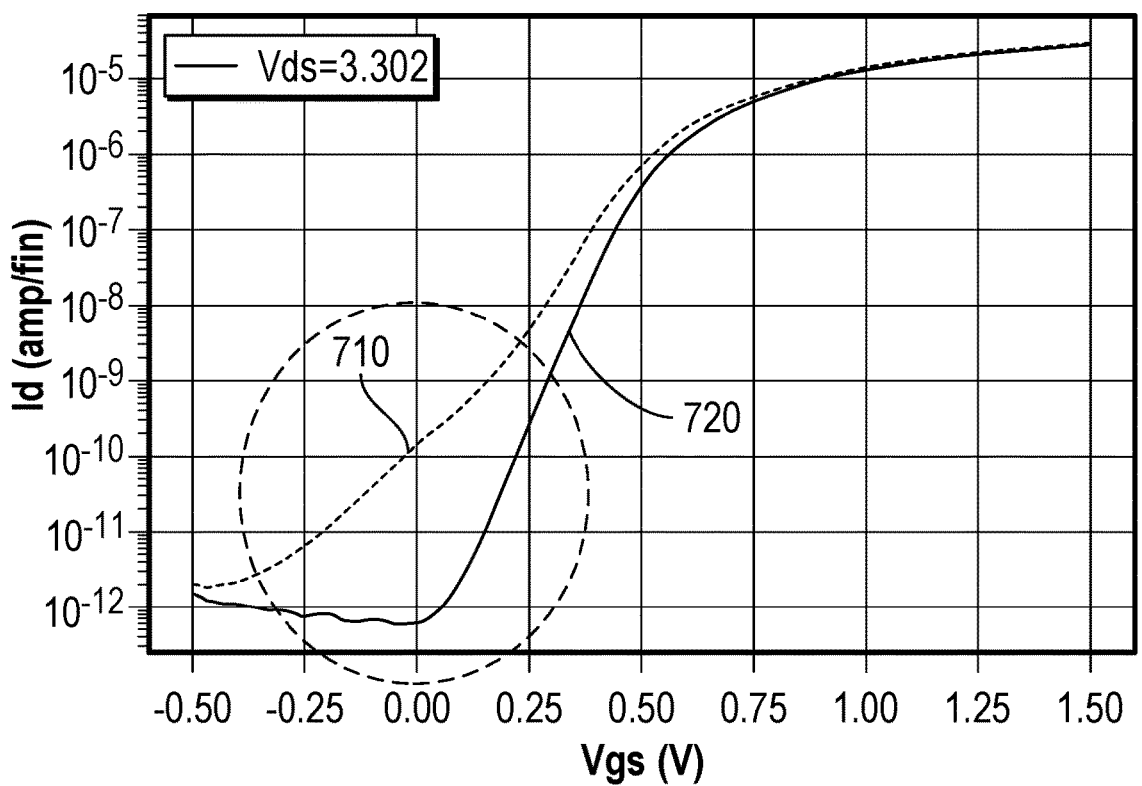
FIG. 7 illustrates current and voltage characteristics of examples of finFET devices.

FIG. 7 illustrates the current and voltage characteristics of example finFET devices. The horizontal axis represents the gate to source voltage (Vgs) in volts, and the vertical axis represents the drain current (Id) in amps per fin.

A curve 710 illustrates example Id/Vgs characteristics of a finFET device where the total number of the fin portions in each of the second portion and the fourth portion (see, e.g., sections 2 and 4) is the same as the total number of the fin portions in each of the first portion, the third portion and the fifth portion (see, e.g., sections 1, 3 and 5). In this case, the total number of the fin portions in a drift region (e.g., each of the drift regions 1 and 2) is the same as the total number of fin portions in each of the first portion, the third portion and the fifth portion.

A curve 720 illustrates example Id/Vgs characteristics of a finFET device where the total number of the fin portions in each of the second portion and the fourth portion (see, e.g., sections 2 and 4) is fewer than the total number of the fin portions in each of the first portion, the third portion and the fifth portion (see, e.g., sections 1, 3 and 5). In this case, the total number of the fin portions in a drift region (e.g., each of the drift regions 1 and 2) is fewer than the total number of the fin portions in each of the first portion, the third portion and the fifth portion.

While the device of the curve 710 may have a lower Ron than the device of the cure 720 (as there are more fin portions in the drift regions), the device of the curve 710 has a higher breakdown voltage than the device of the curve 720. For the device of the curve 710, by including fin portions in the drift regions, the Ron is reduced but the breakdown voltage is lower than a desired level. For the device of the curve 720, by including a fewer number of fin portions in the drift regions, the Ron is reduced over a device without any fin portions in the drift region, and at the same time, the breakdown voltage is increased to a desired level.

Figure 8:
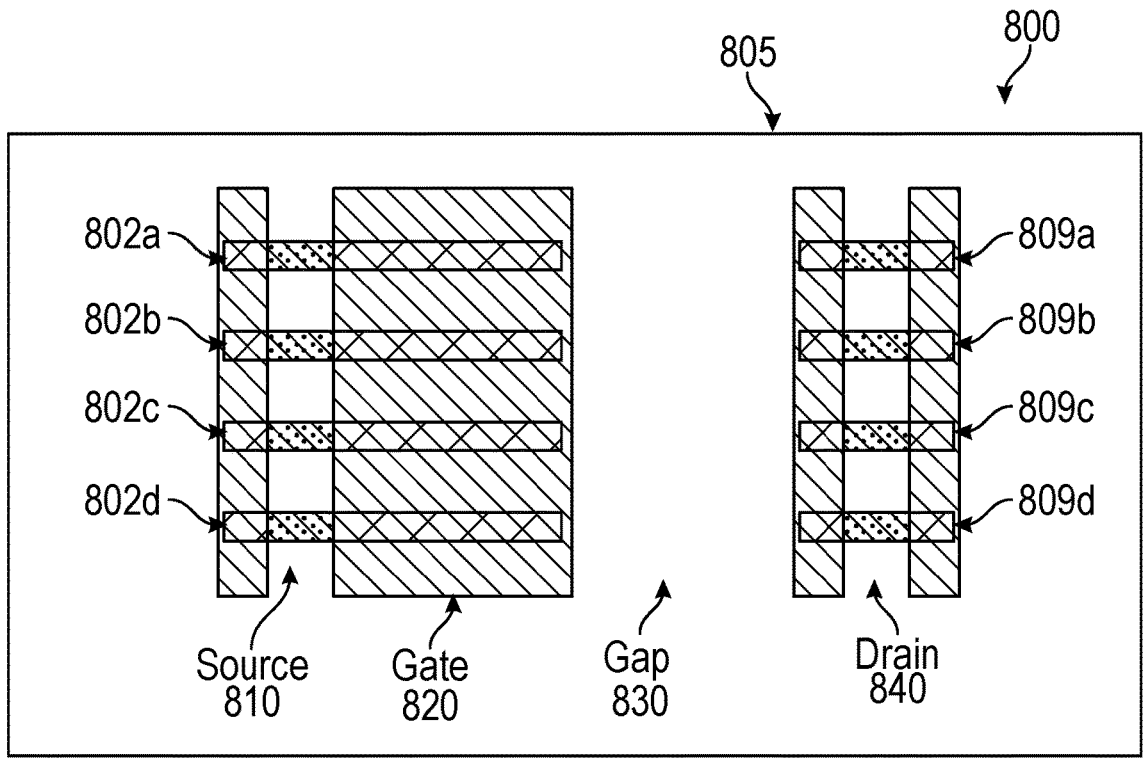
FIG. 8 illustrates a planar top view of another example of a finFET device.

FIG. 8 illustrates a planar top view of another example of a finFET device. A finFET device 800 has a fin structure including left fin portions 802a, 802b, 802c and 802d and right fin portions 809a, 809b, 809c and 809d. A source 810 is in the left fin portions 802a, 802b, 802c and 802d. A gate 820 is over the left fin portions 802a, 802b, 802c and 802d. A drain 840 is in the right fin portions 809a, 809b, 809c and 809d. The left fin portions 802a, 802b, 802c and 802d are separated from the right fin portions 809a, 809b, 809c and 809d by a gap 830. The finFET device 800 does not have any fin portions in the gap 830.

The finFET device 100 shown in FIGS. 1A, 1B, 2, 3 and 4 have improved Ron and breakdown voltage in comparison to the finFET device 800. In one or more aspects, the finFET device 100 has a lower Ron and a higher breakdown voltage than the finFET device 800 because in the finFET device 100, its drift region (or each of the second and fourth portions) includes fin portions where the total number of the fin portions in a drift region (or each of the second and fourth portions) is fewer than the total number of the fin portions in each of the first portion, the third portion and the fifth portion. By including fin portions in the drift region, the Ron of the finFET device 100 is reduced in comparison to the finFET device 800, and by having a fewer number of fin portions in the drift region, the breakdown voltage of the finFET device 100 is increased. Furthermore, the finFET device 100 can be fabricated without additional fabrication masks and without additional processing steps as compared to the finFET device 800.

It is noted that dimensional aspects (e.g., gate width, thickness, fin height, fin length, regions sizes) provided above are examples and that other values for the dimensions may be utilized in accordance with one or more implementations. Furthermore, the dimensional aspects provided above are generally nominal values. As would be appreciated by a person skilled in the art, each dimensional aspect, such as an oxide thickness, has a tolerance associated with the dimensional aspect. For example, in terms of an oxide thickness, the tolerance can be a function of the process utilized in depositing or growing the oxide. In one or more example, a dielectric material may be silicon dioxide, silicon nitride or other dielectric material.

Referring back to FIG. 1A, in one or more implementations, section 1 adjoins section 2, which adjoins section 3, which adjoins section 4, which adjoins section 5. In one or more examples, a fin structure (e.g., including fins 101a-e) includes a first portion (in or across section 1), which adjoins a second portion (in or across section 2), which adjoins a third portion (in or across section 3), which adjoins a fourth portion (in or across section 4), which adjoins a fifth portion (in or across section 5). In one or more examples, for a fin 101a, a fin portion 102a is separated (by at least a separation area in section 2) from a fin portion 103a, which is separated (by at least a separation area in section 4) from a fin portion 109a. Likewise, for a fin 101e, a fin portion 102e is separated (by at least a separation area in section 2) from a fin portion 103e, which is separated (by at least a separation area in section 4) from a fin portion 109e. For a fin 101b, a fin portion 102b adjoins a fin portion 108.1b, which adjoins a fin portion 103b, which adjoins a fin portion 108.2b, which adjoins a fin portion 109b. Likewise, for a fin 101c, a fin portion 102c adjoins a fin portion 108.1c, which adjoins a fin portion 103c, which adjoins a fin portion 108.2c, which adjoins a fin portion 109c. Likewise, for a fin 101d, a fin portion 102d adjoins a fin portion 108.1d, which adjoins a fin portion 103d, which adjoins a fin portion 108.2d, which adjoins a fin portion 109d. The term adjoining may refer to abutting, touching, being in direct contact with, being contiguous with, or the like.

In one or examples, for a fin 101a, a left end portion of the fin portion 102a adjoins a fin portion (or source) 104.1a, which adjoins a fin (or channel) portion 106.1a, which is separated (by at least a separation area in section 2) from a left end of the fin portion 103a, which adjoins a fin portion (or drain) 107a, which adjoins a right end of the fin portion 103a, which is separated (by at least a separation area in section 4) from a fin (or channel) portion 106.2a, which adjoins a fin portion (or source) 104.2a, which adjoins a right end portion of the fin portion 109a. A fin 101e has similar adjoining and separating portions as the fin 101a. For a fin 101b, a left end portion of the fin portion 102b adjoins a fin portion (or source) 104.1b, which adjoins a fin (or channel) portion 106.1b, which adjoins a fin portion 108.1b, which adjoins a fin portion 103b, which adjoins a fin portion 106.2b, which adjoins a fin portion (or source) 104.2b, which adjoins a right end portion of the fin portion 109b. The fins 101c and 101d have similar adjoining portions as the fin 101b.

In one or more implementations of a fabrication process, each of the fins 101b-d is fabricated as one piece, and each of the fins 101a and 101e is fabricated as three pieces. The adjoined portions (excluding the sources/drains 104.1a-e, 107a-e and 104.2a-e) may be fabricated as one piece. In one or more examples, the fins 101a-e are fabricated at the same time. In the description provided in this paragraph, (i) the sources/drains 104.1a-e, 107a-e and 104.2a-e may be formed after the fins 101a-e are formed, and (ii) the sources/drains 104.1a-e, 107a-e and 104.2a-e may be formed simultaneously.

Various examples of aspects of the disclosure are described below for convenience. These are provided as examples, and do not limit the subject technology. Some of the examples described below are illustrated with respect to the figures disclosed herein simply for illustration purposes without limiting the scope of the subject technology.

One or more implementations provide a fin-based field effect transistor (finFET) device (e.g., 100), including: a fin structure (e.g., 101a-e) having a first portion (e.g., in or across section 1), a second portion (e.g., in or across section 2) and a third portion (e.g., in or across section 3); a first gate structure (e.g., gate 1) disposed over at least part of the first portion; a first source/drain region (e.g., source 1, 104.1a-e) disposed in the first portion; and a second drain/source region (e.g., drain 1, 107a-e) disposed in the third portion, wherein: each of the first, second and third portions comprises one or more fin portions (see, e.g., one or more of 102a-e, 108.1b-d, 103a-e); and a total number of fin portions in the second portion (e.g., 108.1b, 108.1c, 108.1d) is fewer than a total number of fin portions in the first portion (e.g., 102a, 102b, 102c, 102d, 102e). The second portion may include a drift region. The second portion does not include the first gate structure, the first source/drain region, or the second drain/source region.

One or more examples provide that: a first fin portion in the first portion (e.g., 102c in FIG. 2) is connected to a first fin portion in the third portion (e.g., 103c) via a first fin portion in the second portion (e.g., 108.1c); a second fin portion in the first portion (e.g., 102e in FIG. 3) is separated from a second fin portion in the third portion (e.g., 103e) by at least a separation area in the second portion (e.g., 308); the first fin portion in the second portion (e.g., 108.1c) is over a first part of a first well region (e.g., 115) and is not over a trench (e.g., 111, 110c, 112c); and the separation area in the second portion (e.g., 308) is over a second part of the first well region (e.g., 115) and is over at least part of a second trench (e.g., 110e).

One or more examples provide that: a third fin portion in the first portion (e.g., 102d in FIG. 1A) is connected to a third fin portion in the third portion (e.g., 103d) via a third fin portion in the second portion (e.g., 108.1d); a first region at a first end portion between the first and third fin portions in the first portion (e.g., a left end region between 102c and 102d along CC' in FIG. 1A; e.g., 104.11c in FIG. 4) is over a first part of a second well region (e.g., 114 in FIG. 4) and is over at least part of a third trench (e.g., 118c in FIG. 4); a second region at the first gate structure (e.g., gate 1 in FIG. 4) between the first and third fin portions in the first portion (e.g., between 102c and 102d) is over a second part of the second well region (e.g., 114 in FIG. 4) and is over a third part of the first well region (e.g., 115 in FIG. 4); a third region between the first and third fin portions in the second portion (e.g., 108.11c in FIG. 4) is over a fourth part of the first well region (e.g., 115) and is over at least part of a fourth trench (e.g., 110c); and a fourth region between the first and third fin portions in the third portion (e.g., 107.11c in FIG. 4) is over a fifth part of the first well region (e.g., 115) and is over at least part of a fifth trench (e.g., 119c in FIG. 4).

One or more examples provide that: at least part of the first portion (e.g., part of the first portion including 102b-d) adjoins the second portion; the second portion adjoins at least part of the third portion (e.g., part of the third portion including 103b-d); and the first portion (e.g., across section 1) is at a first side of the second portion (e.g., across section 2), and the third portion (e.g., across section 3) is at a second side of the second portion that is opposite to the first side of the second portion.

One or more examples provide that: the first portion comprises two or more fin portions (e.g., 102a-e); the third portion comprises two or more fin portions (e.g., 103a-e) corresponding to the two or more fin portions of the first portion; all fin portions in the first, second and third portions are parallel to one another; at least one of the two or more fin portions of the first portion (e.g., 102a, 102e) is separated from at least corresponding one of the two or more fin portions of the third portion (e.g., 103a, 103e); and at least another one of the two or more fin portions of the first portion (e.g., 102b, 102c, 102d) is connected to at least corresponding another one of the two or more fin portions of the third portion (e.g., 103b, 103c, 103d) via at least one of the one or more fin portions of the second portion (e.g., 108.1b, 108.1c, 108.1d).

One or more examples provide that the at least one of the two or more fin portions of the first portion (e.g., 102a, 102e) and the at least corresponding one of the two or more fin portions of the third portion (e.g., 103a, 103e) are separated from each other by at least a separation area in the second portion (e.g., 308).

One or more examples provide that: the second portion comprises a first outer portion (e.g., 2T in FIG. 1A), a middle portion (e.g., 2M in FIG. 1A) and a second outer portion (e.g., 2B in FIG. 1A) that are parallel to one another; the first and second outer portions and the middle portion of the second portion are located between the first portion (e.g., across section 1) and the third portion (e.g., across section 3); the first outer portion of the second portion is at a first side of the middle portion of the second portion, and the second outer portion of the second portion is at a second side of the middle portion of the second portion that is opposite to the first side of the middle portion; the middle portion (e.g., 2M) of the second portion comprises one or some fin portions (e.g., 108.1b, 108.1c, 108.1d); and the first and second outer portions of the second portion (e.g., 2T and 2B) exclude fin portions.

One or more examples provide that the one or some fin portions of the middle portion of the second portion (e.g., 108.1b, 108.1c, 108.1d) are connected to corresponding one or some fin portions of the first portion (e.g., 102b, 102c, 102d) and connected to corresponding one or some fin portions of the third portion (e.g., 103b, 103c, 103d).

One or more examples provide that: each of the first and third portions comprises a first outer portion (e.g., 1T, 3T), a middle portion (e.g., 1M, 3M) and a second outer portion (e.g., 1B, 3B) that are parallel to one another; the first and second outer portions of the second portion (e.g., 2T, 2B) are located between the first and second outer portions of the first portion (e.g., 1T, 1B) and the first and second outer portions of the third portion (e.g., 3T, 3B), respectively; the first outer portion of the first portion (e.g., 1T) is at a first side of the middle portion of the first portion (e.g., 1M), and the second outer portion of the first portion (e.g., 1B) is at a second side of the middle portion of the first portion (e.g., 1M) that is opposite to the first side of the first portion; the first outer portion of the third portion (e.g., 3T) is at a first side of the middle portion of the third portion (e.g., 3M), and the second outer portion of the third portion (e.g., 3B) is at a second side of the middle portion of the third portion that is opposite to the first side of the third portion; the one or some fin portions of the middle portion of the second portion (e.g., 108.1b, 108.1c, 108.1d) are connected to corresponding one or some fin portions of the middle portion of the first portion (e.g., 102b, 102c, 102d) and connected to corresponding one or some fin portions of the middle portion of the third portion (e.g., 103b, 103c, 103d); and some fin portions of the first and second outer portions of the first portion (e.g., 102a, 102e) and some fin portions of the corresponding first and second outer portions of the third portion (e.g., 103a, 103e) are separated by at least the corresponding first and second outer portions of the second portion (e.g., 2T, 2B).

One or more examples provide that: the fin structure (e.g., 101a-e) further comprises a fourth portion (e.g., in or across section 4) and a fifth portion (e.g., in or across section 5); the finFET device further comprises: a second gate structure (e.g., gate 2) disposed over at least part of the fifth portion; and a third source/drain region (e.g., source 2, 104.2a-e) disposed in the fifth portion; and a total number of fin portions in the fourth portion (e.g., 108.2b, 108.2c, 108.2d) is fewer than a total number of fin portions in the fifth portion (e.g., 109a, 109b, 109c, 109d, 109e).

One or more examples provide that: the total number of fin portions in the second portion (e.g., 108.1b, 108.1c, 108.1d) is one or greater than one; the total number of fin portions in the second portion is same as the total number of fin portions in the fourth portion (e.g., 108.2b, 108.2c, 108.2d); the total number of fin portions in the first portion (e.g., 102a, 102b, 102c, 102d, 102e) is same as a total number of fin portions in the third portion (e.g., 103a, 103b, 103c, 103d, 103e); and the total number of fin portions in the first portion is same as the total number of fin portions in the fifth portion (e.g., 109a, 109b, 109c, 109d, 109e).

One or more examples provide an integrated circuit (e.g., 600) having a plurality of devices, wherein each of the plurality of devices comprises the finFET device (e.g., 100).

One or more implementations provide a fin-based field effect transistor (finFET) device (e.g., 100), including: a fin structure (e.g., 101a-e) having a first portion (e.g., in or across section 1), a second portion (e.g., in or across section 2) and a third portion (e.g., in or across section 3); a first gate structure (e.g., gate 1) disposed over at least part of the first portion; a first source/drain region (e.g., source 1, 104.1a-e) disposed in the first portion; and a second drain/source region (e.g., drain 1, 107a-e) disposed in the third portion, wherein: each of the first, second and third portions comprises one or more fin portions; a first fin portion in the first portion (e.g., 102b, 102c, 102d)) is connected to a first fin portion in the third portion (e.g., 103b, 103c, 103d) via a first fin portion in the second portion (e.g., 108.1b, 108.1c, 108.1d); and a second fin portion in the first portion (e.g., 102a, 102e) is separated from a second fin portion in the third portion (e.g., 103a, 103e) by at least a separation area in the second portion (e.g., 308).

One or more examples provide that: the first fin portion in the second portion (e.g., 108.1c) is above a substrate (e.g., 105) and is not over a trench (e.g., 111); and the separation area (e.g., 308) in the second portion is above the substrate and is over at least part of a second trench (e.g., 110e).

One or more examples provide that: a third fin portion in the first portion is connected to a third fin portion in the third portion via a third fin portion in the second portion; a first region between the first and third fin portions in the first portion is above the substrate and is over at least part of a third trench; a second region between the first and third fin portions in the first portion is above the substrate and is over at least another part of the third trench and over at least part of a fourth trench; a third region between the first and third fin portions in the second portion is above the substrate and is over at least another part of the fourth trench; and a fourth region between the first and third fin portions in the third portion is above the substrate and is over at least part of a fifth trench.

One or more examples provide that: the second portion comprises a first outer portion, a middle portion and a second outer portion that are parallel to one another; the first and second outer portions and the middle portion of the second portion are located between the first portion and the third portion; the first outer portion of the second portion is at a first side of the middle portion of the second portion, and the second outer portion of the second portion is at a second side of the middle portion of the second portion that is opposite to the first side of the middle portion; the middle portion of the second portion comprises one or some fin portions; and the first and second outer portions of the second portion exclude fin portions.

One or more examples provide that: each of the first and third portions comprises a first outer portion, a middle portion and a second outer portion that are parallel to one another; the first and second outer portions of the second portion are located between the first and second outer portions of the first portion and the first and second outer portions of the third portion, respectively; the first outer portion of the first portion is at a first side of the middle portion of the first portion, and the second outer portion of the first portion is at a second side of the middle portion of the first portion that is opposite to the first side of the first portion; the first outer portion of the third portion is at a first side of the middle portion of the third portion, and the second outer portion of the third portion is at a second side of the middle portion of the third portion that is opposite to the first side of the third portion; the one or some fin portions of the middle portion of the second portion are connected to corresponding one or some fin portions of the middle portion of the first portion and connected to corresponding one or some fin portions of the middle portion of the third portion; and fin portions of the first and second outer portions of the first portion and fin portions of the corresponding first and second outer portions of the third portion are separated by at least the corresponding first and second outer portions of the second portion.

One or more implementations provide a method of fabricating a fin-based field effect transistor (finFET) device (e.g., 100), wherein the method includes: providing a fin structure (e.g., 101a-e) including a first portion, a second portion and a third portion; providing a first source/drain region in the first portion (e.g., source 1); providing a second drain/source region in the third portion (e.g., drain 1); and providing a first gate structure (e.g., gate 1) over at least part of the first portion, wherein: each of the first, second and third portions comprises one or more fin portions; and a total number of fin portions in the second portion (e.g., 108.1b, 108.1c, 108.1d) is fewer than a total number of fin portions in the first portion (e.g., 102a, 102b, 102c, 102d, 102e).

One or more examples provide that the method further includes: providing a first well region (e.g., 115) formed in a substrate and doped with a first type of dopant, wherein: a first fin portion in the first portion is connected to a first fin portion in the third portion via a first fin portion in the second portion; a second fin portion in the first portion is separated from a second fin portion in the third portion by at least a separation area in the second portion; the first fin portion in the second portion is over a first part of the first well region and is not over a trench; and the separation area in the second portion is over a second part of the first well region and is over at least part of a second trench.

One or more examples provide that the method further includes: providing a second well region (e.g., 114) formed in the substrate and doped with a second type of dopant, wherein: a third fin portion in the first portion is connected to a third fin portion in the third portion via a third fin portion in the second portion; a first region at a first end portion between the first and third fin portions in the first portion is over a first part of the second well region and is over at least part of a third trench; a second region at the first gate structure between the first and third fin portions in the first portion is over a second part of the second well region and is over a third part of the first well region; a third region between the first and third fin portions in the second portion is over a fourth part of the first well region and is over at least part of a fourth trench; and a fourth region between the first and third fin portions in the third portion is over a fifth part of the first well region and is over at least part of a fifth trench.

In one or more examples, the term "gate" may refer to an insulated gate terminal of a FET. A physical structure of the gate terminal may be referred to as a gate electrode. In one or more examples, the terms "source" and "drain" may refer to the source and drain terminals of a FET between which conduction occurs under the influence of an electric field subsequent to inversion of the semiconductor surface under the influence of an electric field resulting from a voltage applied to the gate terminal of the FET. Designers may designate a particular source/drain terminal to be a "source" or a "drain" on the basis of the voltage to be applied to that terminal when the FET is operated in a circuit.

In one or more examples, the terms "contact" and "via" may both refer to structures in a chip used for electrical connection of conductors, for example, for different interconnect levels of the chip. These terms can describe both an opening in an insulator in which the structure will be completed as well as the completed structure itself.

In one or more examples, the terms "substrate" and "substrate material" may refer to the physical object that is the basic work piece transformed by various process operations into the desired microelectronic configuration. A typical substrate used for the manufacture of integrated circuits is a wafer. Wafers may be made of semiconducting (e.g., bulk silicon), non-semiconducting (e.g., glass), or combinations of semiconducting and non-semiconducting materials (e.g., silicon-on-insulator (SOI)). In the semiconductor industry, a bulk silicon wafer is commonly used for the manufacture of integrated circuits.

In the semiconductor industry environment of foundries and fabless companies, the foundries develop, specify, and provide the physical structures that designers use to implement their designs. Foundries provide manufacturing services to many fabless semiconductor companies, but to operate profitably they optimize their manufacturing processes to achieve high yields. Such optimizations generally require that limitations be placed on the variety of structures that can be produced by a particular manufacturing process. Consistent with the foregoing, foundries typically provide a limited set of transistor structures that are intended to cover a broad range of circuit applications.

The terms "configured to" and "operable to" do not imply any particular tangible or intangible modification of a subject, but, rather, are intended to be used interchangeably. The terms such as "top," "middle, "bottom," "front," "rear," "side," "horizontal," "vertical," and the like refer to an arbitrary frame of reference, rather than to the ordinary gravitational frame of reference. Thus, such a term may extend upwardly, downwardly, diagonally, or horizontally in a gravitational frame of reference. The terms "on," "above," "below," "under," and the like refer to an arbitrary frame of reference, rather than to the ordinary gravitational frame of reference, and these terms may refer to directly or indirectly "on," "above," "below," "under," and the like, respectively. The terms "coupled," "connected," and the like may refer to directly or indirectly "coupled," "connected," and the like, respectively. The terms "rows," "columns" and the like refer to an arbitrary frame of reference, and they may refer to horizontal or vertical rows or columns.

A reference to an element in the singular is not intended to mean "one and only one" unless specifically so stated, but rather "one or more." For example, "a" module may refer to one or more modules. An element proceeded by "a," "an," "the," or "said" does not, without further constraints, preclude the existence of additional same elements. Unless specifically stated otherwise, the term "some" refers to one or more. Furthermore, while the subject disclosure may provide many example ranges and values, these are non-limiting examples, and other ranges and values are within the scope of the subject technology.

Headings and subheadings, if any, are used for convenience only and do not limit the invention. The word "exemplary" is used to mean serving as an example or illustration. Any implementation described herein as an "example" is not necessarily to be construed as preferred or advantageous over other implementations. To the extent that the term "include," "have," or the like is used, such term is intended to be inclusive in a manner similar to the term "comprise" as "comprise" is interpreted when employed as a transitional word in a claim. Relational terms such as first and second and the like may be used simply for ease of understanding without necessarily requiring or implying any actual relationship or order between elements or actions and without necessarily requiring or implying that they have different characteristics unless stated otherwise.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" and "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order.

The disclosure is provided to enable any person skilled in the art to practice the various aspects described herein. In some instances, structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples, and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter. The claims are not intended to be limited to the aspects described herein, but are to be accorded the full scope consistent with the claim language and to encompass all legal equivalents. Notwithstanding, none of the claims are intended to embrace subject matter that fails to satisfy the requirements of the applicable patent law, nor should they be interpreted in such a way.

What is claimed is:

1. A fin-based field effect transistor (finFET) device, comprising:
   a fin structure comprising a first portion, a second portion, a third portion, a fourth portion and a fifth portion;
   a first gate structure disposed over at least part of the first portion and a second gate structure disposed over at least part of the fifth portion;
   a first source/drain region disposed in the first portion;
   a second drain/source region disposed in the third portion; and
   a third source/drain region disposed in the fifth portion; wherein:
      each of the first, second and third portions comprises one or more fin portions; and
      a total number of fin portions in the second portion is fewer than a total number of fin portions in the first portion and a total number of fin portions in the fourth portion is fewer than a total number of fin portions in the fifth portion.

2. The finFET device of claim 1, wherein:
   a first fin portion in the first portion is connected to a first fin portion in the third portion via a first fin portion in the second portion;
   a second fin portion in the first portion is separated from a second fin portion in the third portion by at least a separation area in the second portion;
   the first fin portion in the second portion is over a first part of a first well region and is not over a trench; and
   the separation area in the second portion is over a second part of the first well region and is over at least part of a second trench.

3. The finFET device of claim 2, wherein:
   a third fin portion in the first portion is connected to a third fin portion in the third portion via a third fin portion in the second portion;
   a first region at a first end portion between the first and third fin portions in the first portion is over a first part of a second well region and is over at least part of a third trench;

a second region at the first gate structure between the first and third fin portions in the first portion is over a second part of the second well region and is over a third part of the first well region;
a third region between the first and third fin portions in the second portion is over a fourth part of the first well region and is over at least part of a fourth trench; and
a fourth region between the first and third fin portions in the third portion is over a fifth part of the first well region and is over at least part of a fifth trench.

4. The finFET device of claim 1, wherein:
at least part of the first portion adjoins the second portion;
the second portion adjoins at least part of the third portion; and
the first portion is at a first side of the second portion, and the third portion is at a second side of the second portion that is opposite to the first side of the second portion.

5. The finFET device of claim 1, wherein:
the first portion comprises two or more fin portions;
the third portion comprises two or more fin portions corresponding to the two or more fin portions of the first portion;
all fin portions in the first, second and third portions are parallel to one another;
at least one of the two or more fin portions of the first portion is separated from at least corresponding one of the two or more fin portions of the third portion; and
at least another one of the two or more fin portions of the first portion is connected to at least corresponding another one of the two or more fin portions of the third portion via at least one of the one or more fin portions of the second portion.

6. The finFET device of claim 5, wherein the at least one of the two or more fin portions of the first portion and the at least corresponding one of the two or more fin portions of the third portion are separated from each other by at least a separation area in the second portion.

7. The finFET device of claim 1, wherein:
the second portion comprises a first outer portion, a middle portion and a second outer portion that are parallel to one another;
the first and second outer portions and the middle portion of the second portion are located between the first portion and the third portion;
the first outer portion of the second portion is at a first side of the middle portion of the second portion, and the second outer portion of the second portion is at a second side of the middle portion of the second portion that is opposite to the first side of the middle portion;
the middle portion of the second portion comprises one or some fin portions; and
the first and second outer portions of the second portion exclude fin portions.

8. The finFET device of claim 7, wherein the one or some fin portions of the middle portion of the second portion are connected to corresponding one or some fin portions of the first portion and connected to corresponding one or some fin portions of the third portion.

9. The finFET device of claim 7, wherein:
each of the first and third portions comprises a first outer portion, a middle portion and a second outer portion that are parallel to one another;
the first and second outer portions of the second portion are located between the first and second outer portions of the first portion and the first and second outer portions of the third portion, respectively;
the first outer portion of the first portion is at a first side of the middle portion of the first portion, and the second outer portion of the first portion is at a second side of the middle portion of the first portion that is opposite to the first side of the first portion;
the first outer portion of the third portion is at a first side of the middle portion of the third portion, and the second outer portion of the third portion is at a second side of the middle portion of the third portion that is opposite to the first side of the third portion;
the one or some fin portions of the middle portion of the second portion are connected to corresponding one or some fin portions of the middle portion of the first portion and connected to corresponding one or some fin portions of the middle portion of the third portion; and
some fin portions of the first and second outer portions of the first portion and some fin portions of the corresponding first and second outer portions of the third portion are separated by at least the corresponding first and second outer portions of the second portion.

10. The finFET device of claim 1, wherein:
the total number of fin portions in the second portion is one or greater than one;
the total number of fin portions in the second portion is same as the total number of fin portions in the fourth portion;
the total number of fin portions in the first portion is same as a total number of fin portions in the third portion; and
the total number of fin portions in the first portion is same as the total number of fin portions in the fifth portion.

11. An integrated circuit comprising a plurality of devices, wherein each of the plurality of devices comprises the finFET device of claim 1.

12. A fin-based field effect transistor (finFET) device, comprising:
a fin structure comprising a first portion, a second portion and a third portion, a fourth portion and a fifth portion;
a first gate structure disposed over at least part of the first portion and a second gate structure disposed over at least part of the fifth portion;
a first source/drain region disposed in the first portion; and
a second drain/source region disposed in the third portion; and
a third source/drain region disposed in the fifth portion;
wherein:
each of the first, second and third portions comprises one or more fin portions;
a total number of fin portions in the fourth portion is fewer than a total number of fin portions in the fifth portion;
a first fin portion in the first portion is connected to a first fin portion in the third portion via a first fin portion in the second portion; and
a second fin portion in the first portion is separated from a second fin portion in the third portion by at least a separation area in the second portion.

13. The finFET device of claim 12, wherein:
the first fin portion in the second portion is above a substrate and is not over a trench; and
the separation area in the second portion is above the substrate and is over at least part of a second trench.

14. The finFET device of claim 13, wherein:
a third fin portion in the first portion is connected to a third fin portion in the third portion via a third fin portion in the second portion;

a first region between the first and third fin portions in the first portion is above the substrate and is over at least part of a third trench;
a second region between the first and third fin portions in the first portion is above the substrate and is over at least another part of the third trench and over at least part of a fourth trench;
a third region between the first and third fin portions in the second portion is above the substrate and is over at least another part of the fourth trench; and
a fourth region between the first and third fin portions in the third portion is above the substrate and is over at least part of a fifth trench.

15. The finFET device of claim 12, wherein:
the second portion comprises a first outer portion, a middle portion and a second outer portion that are parallel to one another;
the first and second outer portions and the middle portion of the second portion are located between the first portion and the third portion;
the first outer portion of the second portion is at a first side of the middle portion of the second portion, and the second outer portion of the second portion is at a second side of the middle portion of the second portion that is opposite to the first side of the middle portion;
the middle portion of the second portion comprises one or some fin portions; and
the first and second outer portions of the second portion exclude fin portions.

16. The finFET device of claim 15, wherein:
each of the first and third portions comprises a first outer portion, a middle portion and a second outer portion that are parallel to one another;
the first and second outer portions of the second portion are located between the first and second outer portions of the first portion and the first and second outer portions of the third portion, respectively;
the first outer portion of the first portion is at a first side of the middle portion of the first portion, and the second outer portion of the first portion is at a second side of the middle portion of the first portion that is opposite to the first side of the first portion;
the first outer portion of the third portion is at a first side of the middle portion of the third portion, and the second outer portion of the third portion is at a second side of the middle portion of the third portion that is opposite to the first side of the third portion;
the one or some fin portions of the middle portion of the second portion are connected to corresponding one or some fin portions of the middle portion of the first portion and connected to corresponding one or some fin portions of the middle portion of the third portion; and
fin portions of the first and second outer portions of the first portion and fin portions of the corresponding first and second outer portions of the third portion are separated by at least the corresponding first and second outer portions of the second portion.

17. A method of fabricating a fin-based field effect transistor (finFET) device, comprising:
providing a fin structure comprising a first portion, a second portion a third portion, a fourth portion and a fifth portion;
providing a first source/drain region in the first portion;
providing a second drain/source region in the third portion and a third source/drain region disposed in the fifth portion; and
providing a first gate structure over at least part of the first portion and a second gate structure disposed over at least part of the fifth portion, wherein:
each of the first, second and third portions comprises one or more fin portions; and
a total number of fin portions in the second portion is fewer than a total number of fin portions in the first portion;
and a total number of fin portions in the fourth portion is fewer than a total number of fin portions in the fifth portion.

18. The method of claim 17, further comprising:
providing a first well region formed in a substrate and doped with a first type of dopant,
wherein:
a first fin portion in the first portion is connected to a first fin portion in the third portion via a first fin portion in the second portion;
a second fin portion in the first portion is separated from a second fin portion in the third portion by at least a separation area in the second portion;
the first fin portion in the second portion is over a first part of the first well region and is not over a trench; and
the separation area in the second portion is over a second part of the first well region and is over at least part of a second trench.

19. The method of claim 18, further comprising:
providing a second well region formed in the substrate and doped with a second type of dopant, wherein:
a third fin portion in the first portion is connected to a third fin portion in the third portion via a third fin portion in the second portion;
a first region at a first end portion between the first and third fin portions in the first portion is over a first part of the second well region and is over at least part of a third trench;
a second region at the first gate structure between the first and third fin portions in the first portion is over a second part of the second well region and is over a third part of the first well region;
a third region between the first and third fin portions in the second portion is over a fourth part of the first well region and is over at least part of a fourth trench; and
a fourth region between the first and third fin portions in the third portion is over a fifth part of the first well region and is over at least part of a fifth trench.

* * * * *